(12) United States Patent
Lan

(10) Patent No.: US 7,136,520 B2
(45) Date of Patent: Nov. 14, 2006

(54) METHOD OF CHECKING ALIGNMENT ACCURACY OF PATTERNS ON STACKED SEMICONDUCTOR LAYERS

(75) Inventor: Yuan-Ku Lan, Panchiao (TW)

(73) Assignee: Nanya Technology Corporation, Taoyuan (TW)

(*) Notice: Subject to any disclaimer, the term of this patent is extended or adjusted under 35 U.S.C. 154(b) by 883 days.

(21) Appl. No.: 10/086,928

(22) Filed: Feb. 28, 2002

(65) Prior Publication Data

US 2003/0044057 A1 Mar. 6, 2003

(30) Foreign Application Priority Data

Sep. 4, 2001 (TW) .............................. 90121880 A

(51) Int. Cl.
*G06K 9/00* (2006.01)
(52) U.S. Cl. ...................................... 382/151
(58) Field of Classification Search ................. 382/151
See application file for complete search history.

(56) References Cited

U.S. PATENT DOCUMENTS 4,593,406 A * 6/1986 Stone ........................ 382/288
5,109,430 A * 4/1992 Nishihara et al. ............ 382/151
5,189,707 A * 2/1993 Suzuki et al. ................ 382/151
5,308,682 A * 5/1994 Morikawa ................. 428/195.1
6,327,513 B1 * 12/2001 Ziger ........................ 700/121

* cited by examiner

*Primary Examiner*—Joseph Mancuso
*Assistant Examiner*—Hadi Akhavannik
(74) *Attorney, Agent, or Firm*—Ladas & Parry LLP

(57) ABSTRACT

A method of checking overlap accuracy of patterns on fourth semiconductor layers. The first checking pattern is formed on the first semiconductor layer, the second checking pattern is formed on the second semiconductor layer, the third checking pattern is formed on the third semiconductor layer and the fourth checking pattern is formed on the fourth semiconductor layer. The first, second and third checking patterns overlap to form the first rectangular frame and the fourth checking pattern is surrounded by the first rectangular frame. A first pair of parallel sides of the first rectangular frame is formed by the first checking pattern and the second pair of parallel sides of the first rectangular frame is formed by the second and third checking patterns. Overlap accuracy of the patterns is obtained by checking the location error between the fourth checking pattern and the first checking pattern and the location error between the fourth checking pattern and the second and third checking patterns respectively.

39 Claims, 8 Drawing Sheets

METHOD OF CHECKING ALIGNMENT ACCURACY OF PATTERNS ON STACKED SEMICONDUCTOR LAYERS

FIELD OF THE INVENTION

The present invention relates to a method of checking relative alignment accuracy of patterns transferred on four stacked semiconductor layers, and more particularly to defining checking patterns on four stacked semiconductor layers and measuring relative alignment errors thereof by the method.

BACKGROUND OF THE INVENTION

Semiconductor integrated circuits with a plurality of semiconductor layers are fabricated by deposition, photolithography, etching, implantation, and thermal processes, repeatedly. In photolithography, relative alignment accuracy of patterns transferred on semiconductor layers is critical for semiconductor device fabrication.

FIG. 1A shows a top view of a wafer 1 which is divided into several zones by scribe lines. A plurality of checking patterns are exposed inside predetermined zones 50. The checking patterns are arranged vertically to each other to measure the relative alignment error between the patterns on adjacent semiconductor layers in two dimensions. When the checking patterns on separate semiconductor layers align accurately, the resulting target patterns 60 align with each other accurately. FIG. 1B shows checking patterns defined by conventional photomask exposing. In FIG. 1B, a rectangular checking pattern 12 is defined on a first semiconductor layer 10 and a square checking pattern 22 is defined on a second semiconductor layer 20, wherein the rectangular checking pattern 12 lies at the center of the square checking pattern 22 and the four sides of the rectangular checking pattern 12 are parallel to the four sides of the square checking pattern 22 correspondingly. When the rectangular checking pattern 12 is located at the center of the square checking pattern 22, the target patterns on the other zones of the first semiconductor layer 10 are accurately aligned with the target patterns on the other zones of the second semiconductor layer 20. Furthermore, as shown in FIG. 1B, a rectangular checking pattern 12 is defined on a first semiconductor layer 10 and a square checking pattern 32 is defined on a third semiconductor layer 30, wherein the rectangular checking pattern 12 lies at the center of the square checking pattern 32 and the four sides of the rectangular checking pattern 12 are parallel to the four sides of the square checking pattern 32 correspondingly. When the rectangular checking pattern 12 is located at the center of the square checking pattern 32, target patterns on the other zones of the first semiconductor layer 10 are accurately aligned with target patterns on the other zones of the third semiconductor layer 30.

Moreover, as shown in FIG. 1B, two rectangular checking patterns 42A and 42B are formed in a fourth semiconductor layer 40, wherein the rectangular checking pattern 42A is parallel to the rectangular checking pattern 12 in the Y-axis and the rectangular checking pattern 42B is parallel to the rectangular checking pattern 22 in the X-axis.

The disadvantage of conventional alignment of checking patterns is that target patterns on the third and fourth semiconductor layers 30 and 40 frequently misalign in the X-axis. Generally, the square checking pattern 32 on the third semiconductor layer 30 is assumed to be aligned with the square checking pattern 22 on the second semiconductor layer 20 along the X-axis, and therefore, when the rectangular checking pattern 42b on the fourth semiconductor layer 40 is aligned with the square checking pattern 22 on the second semiconductor layer 20 in the X-axis, the target patterns on the fourth semiconductor layer 40 should be aligned with the target patterns on the third semiconductor layer 30 along the X-axis. However, the square checking pattern 32 on the third semiconductor layer 30 may not align precisely with the square checking pattern 22 on the second semiconductor layer 20 along the X-axis, and the resulting target patterns on the fourth semiconductor layer 40 misalign with the target patterns on the third semiconductor layer 30 along the X-axis.

SUMMARY OF THE INVENTION

To solve the disadvantage mentioned above, a method of checking relative alignment accuracy of patterns on four stacked semiconductor layers is provided according to the present invention. The target patterns on the fourth semiconductor layer formed by the method align with the target patterns on the first semiconductor layer along a first dimension, and the target patterns on the fourth semiconductor layer also align with the target patterns on the second and third semiconductor layer along a direction perpendicular to the first dimension.

One object of the present invention is to provide a method of checking relative alignment accuracy of patterns on a fourth semiconductor layer. The method comprises the following steps: defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns align to define a first rectangular frame, the fourth checking pattern is surrounded by the first rectangular frame, a first pair of parallel sides of the first rectangular frame is defined by the first checking pattern, and a second pair of parallel sides of the first rectangular frame is defined by the second and third checking patterns; measuring relative alignment accuracy between the fourth checking pattern and the first checking pattern; and measuring relative alignment accuracy between the fourth checking pattern and the second and third checking patterns.

One feature of the present invention is the definition of the first checking pattern on a first semiconductor layer, the second checking pattern on a second semiconductor layer, the third checking pattern on a third semiconductor layer and a second rectangular frame as the fourth checking pattern on a fourth semiconductor layer, wherein the first, second and third checking patterns align to define the first rectangular frame, the fourth checking pattern is surrounded by the first rectangular frame, and the second checking pattern is parallel to the third checking pattern.

Another feature of the present invention is that two pairs of first parallel line-shaped patterns are defined on the first semiconductor layer, a pair of second parallel line-shaped patterns is defined on the second semiconductor layer, a pair of third parallel line-shaped patterns is defined on the third semiconductor layer, and a second rectangular frame as the fourth line-shaped patterns is defined on the fourth semiconductor layer. Accordingly, the first, second and third checking patterns align to define the first rectangular frame and the fourth checking pattern is surrounded by the first rectangular frame.

The advantages of the present invention are that the resulting target patterns on the fourth semiconductor layer align with the resulting target patterns on the first semiconductor layer along a first dimension and the resulting target patterns on the four stacked semiconductor layers align with the resulting target patterns on the second and third semiconductor layers along a direction perpendicular to the first dimension.

BRIEF DESCRIPTION OF THE DRAWINGS

The present invention will become more fully understood from the detailed description given herein below and the accompanying drawings, given by way of illustration only and thus not intended to be limitative of the present invention. In the drawings.

DETAILED DESCRIPTION OF THE INVENTION

[First Embodiment]

Figure 1A:
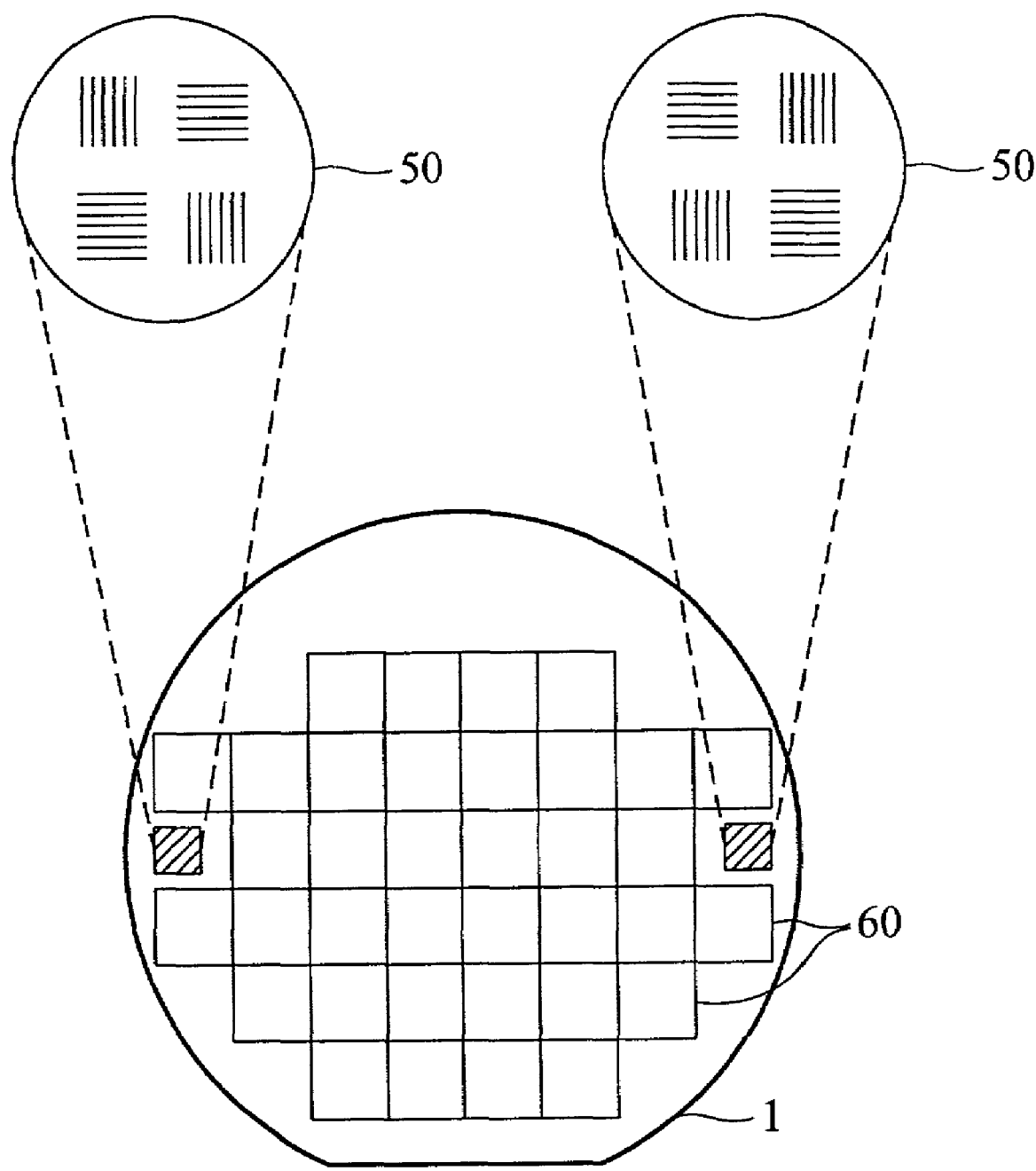
FIG. 1A is the top view of a wafer showing a plurality of checking patterns defined inside the scribe lines.
Figure 1B:
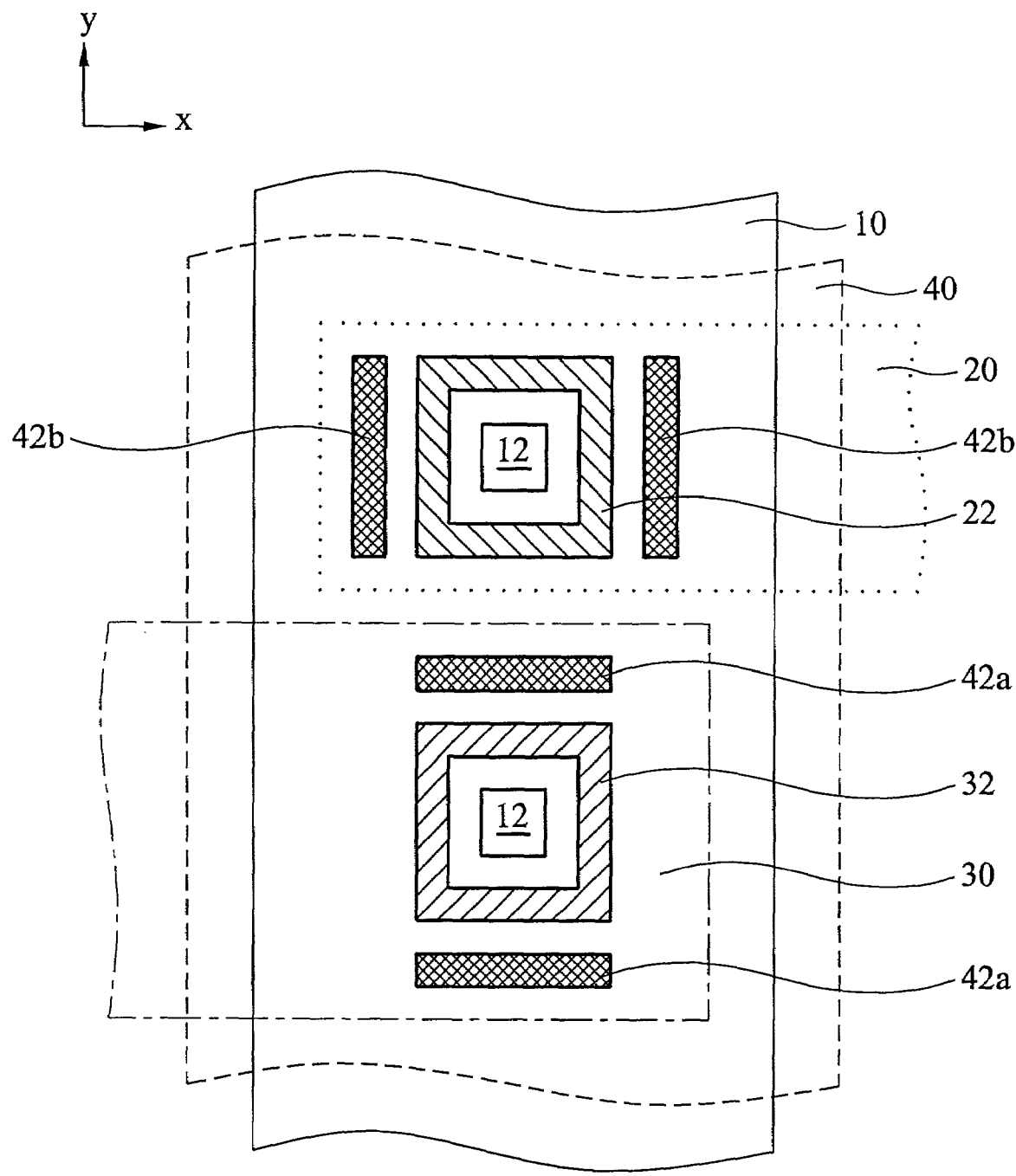
FIG. 1B illustrates the checking patterns defined by conventional aligner photomask.
Figure 2A:
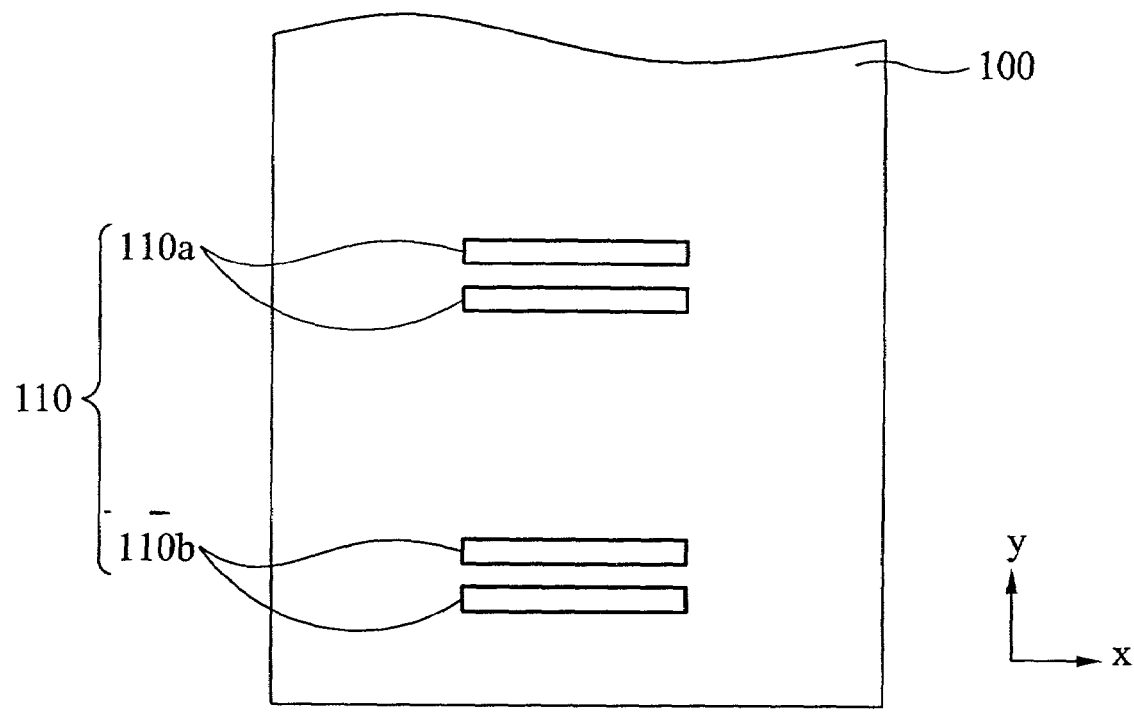
FIG. 2A shows a first checking pattern defined on a first semiconductor layer according to the first embodiment in the present invention.

FIG. 2A shows a first checking pattern defined on a first semiconductor layer according to the first embodiment in the present invention. In FIG. 2A, the first checking pattern 110 comprises two pairs of first line-shaped patterns 110a and 110b parallel to each other and both the first line-shaped patterns 110a and 110b comprise two parallel lines. The first checking pattern 110 is defined by exposing a first photomask on the first semiconductor layer 100 and then developing the pattern 110 thereon.

Figure 2B:
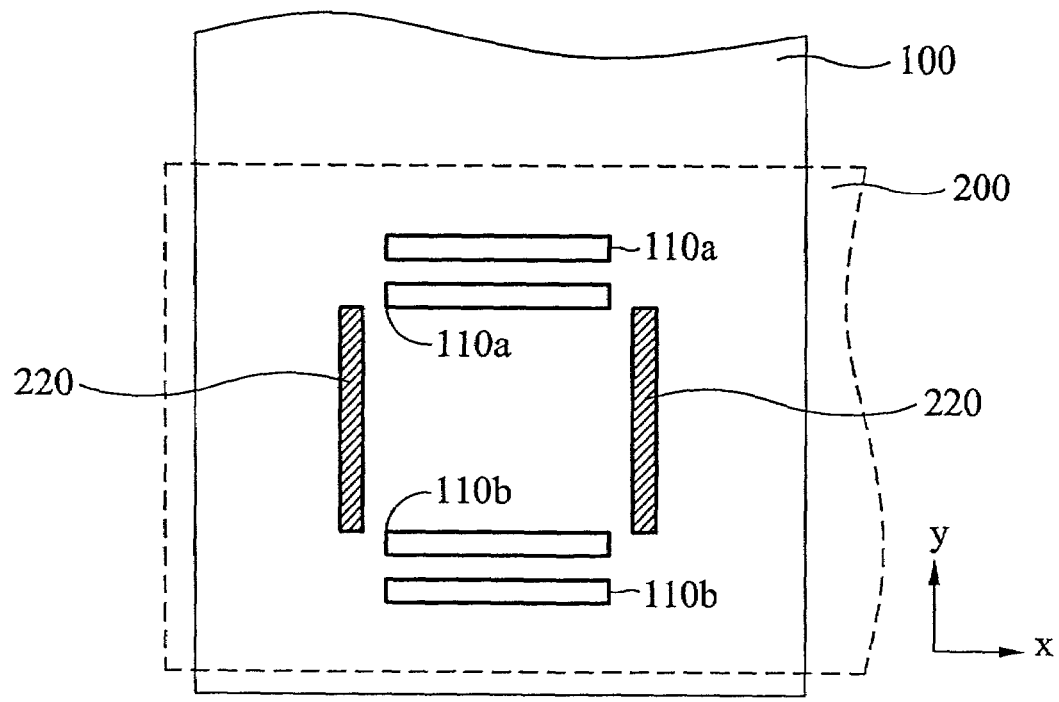
FIG. 2B shows a second checking pattern defined on a second semiconductor layer according to the first embodiment in the present invention.

FIG. 2B shows a second checking pattern defined on a second semiconductor layer according to the first embodiment in the present invention. In FIG. 2B, the second checking pattern comprises a pair of second parallel line-shaped patterns 220. Two lines of the second parallel line-shaped patterns 220 are parallel to each other. The second checking pattern 220 is defined by exposing a second photomask on the second semiconductor layer 200 and then developing the pattern 220 thereon.

Figure 2C:
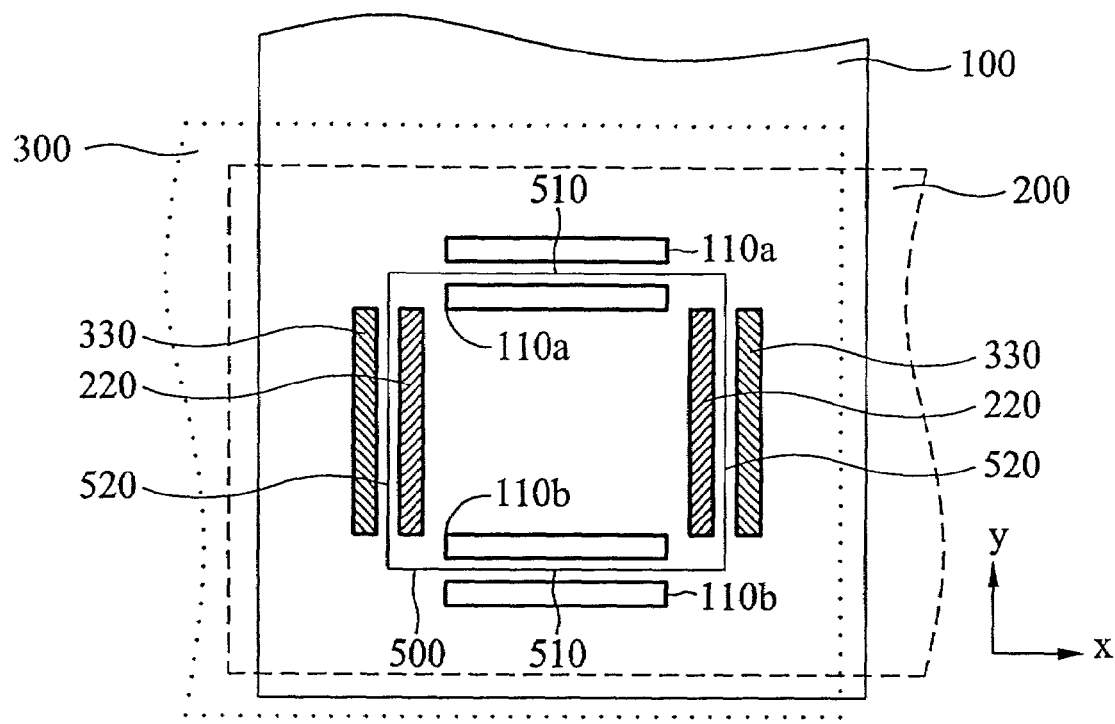
FIG. 2C shows a third checking pattern defined on a third semiconductor layer according to the first embodiment in the present invention.

FIG. 2C shows a third checking pattern defined on a third semiconductor layer according to the first embodiment in the present invention. In FIG. 2C, the third checking pattern comprises a pair of third parallel line-shaped patterns 330. Two lines of the third parallel line-shaped patterns 330 are parallel to each other. The third checking pattern 330 is defined by exposing a third photomask on the third semiconductor layer 300 and then developing the pattern 330 thereon.

As FIG. 2C shows, the two pairs of first line-shaped patterns 110a and 110b, the pair of second parallel line-shaped patterns 220 and the pair of third parallel line-shaped patterns 330 are arranged to define a first rectangular frame 500. The first pair of parallel sides 510 of the first rectangular frame 500 is constructed by the first line-shaped patterns 110a and 110b, and the second pair of parallel sides 520 of the first rectangular frame 500 is constructed by the second parallel line-shaped patterns 220 and the third parallel line-shaped patterns 330. The third parallel line-shaped patterns 330 are located outside the second pair of parallel sides 520 of the first rectangular frame 500 and the second parallel line-shaped patterns 220 are located inside the second pair of parallel sides 520. Accordingly, the interval between the two lines of the third parallel line-shaped patterns 330 is larger than the interval between the two lines of the second parallel line-shaped patterns 220.

Figure 2D:
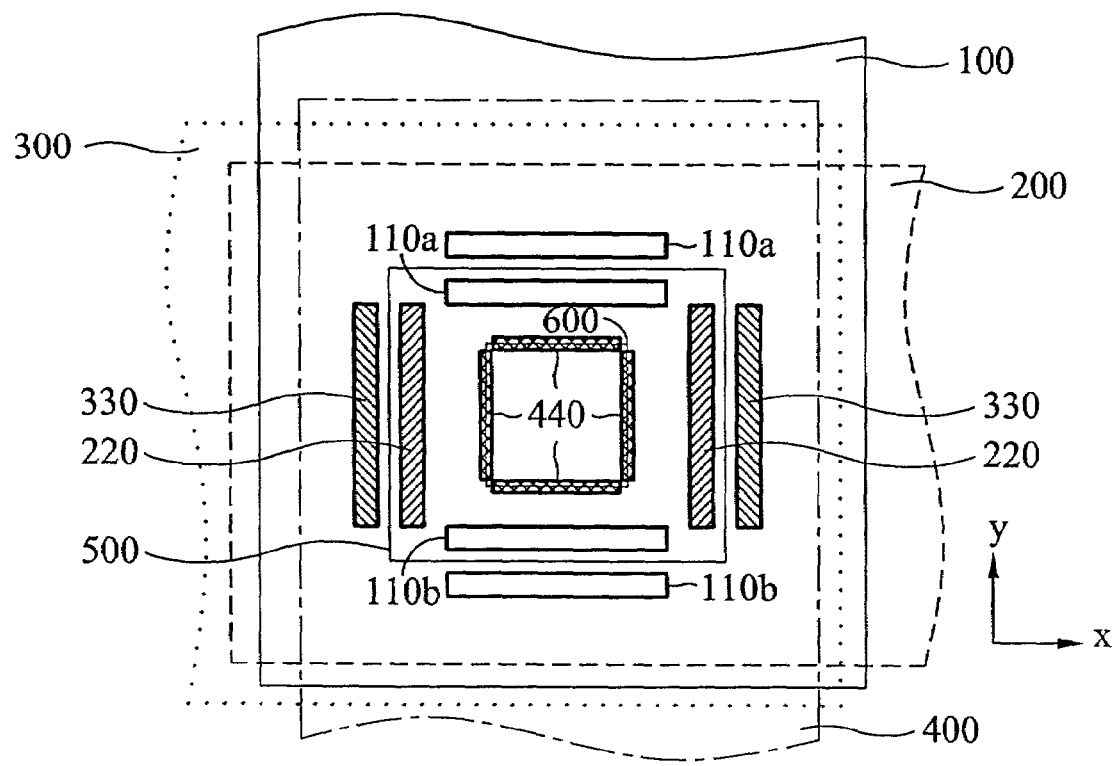
FIG. 2D shows a fourth checking pattern defined on a fourth semiconductor layer according to the first embodiment in the present invention.

FIG. 2D shows a fourth checking pattern defined on a fourth semiconductor layer according to the first embodiment in the present invention. The fourth checking pattern 440 is defined by exposing the fourth photomask on the fourth semiconductor layer 400 and then developing the pattern 440 thereon. As FIG. 2D shows, the fourth photomask defines a second rectangular frame 600 as the fourth checking pattern 440 constructed by four lines on the fourth semiconductor layer 400 and the fourth checking pattern 440 is surrounded by the first rectangular frame 500.

After the checking patterns are defined on the four stacked semiconductor layers, alignment accuracy of the resulting target patterns on the four semiconductor layer is measured by overlay scanning. As FIG. 2D shows, the center position of the first checking pattern 110 along the first dimension (i.e. Y-axis) is obtained and the center position of the fourth checking pattern 440 along the Y-axis is also measured. When the difference between the center position of the first checking pattern 110 along the Y-axis and the center position of the fourth checking pattern 440 along the Y-axis is within a predetermined error range, the resulting target patterns on the fourth semiconductor layer align with those on the first semiconductor layer along the Y-axis.

Subsequently, the center positions of the second checking pattern and the third checking pattern are measured by overlap scanning. A first average position along the second dimension (i.e. X-axis) between the second checking pattern 220 and the third checking pattern 330 on one side is measured. A second average position between the second checking pattern 220 and the third checking pattern 330 on the other side is then measured. An average value of the first average position and the second average position is obtained to represent the center position of the second checking pattern 220 and the third checking pattern 330. Subsequently, the center position of the fourth checking pattern 440 along the X-axis is measured. When the difference between the center position of the second checking pattern 220 and the third checking pattern 330 and the center position of the fourth checking pattern 440 along the X-axis is measured is within a predetermined error range, the resulting target patterns on the fourth semiconductor layer align with those on the second and third semiconductor layers along the X-axis.

[Second Embodiment]

Figure 3A:
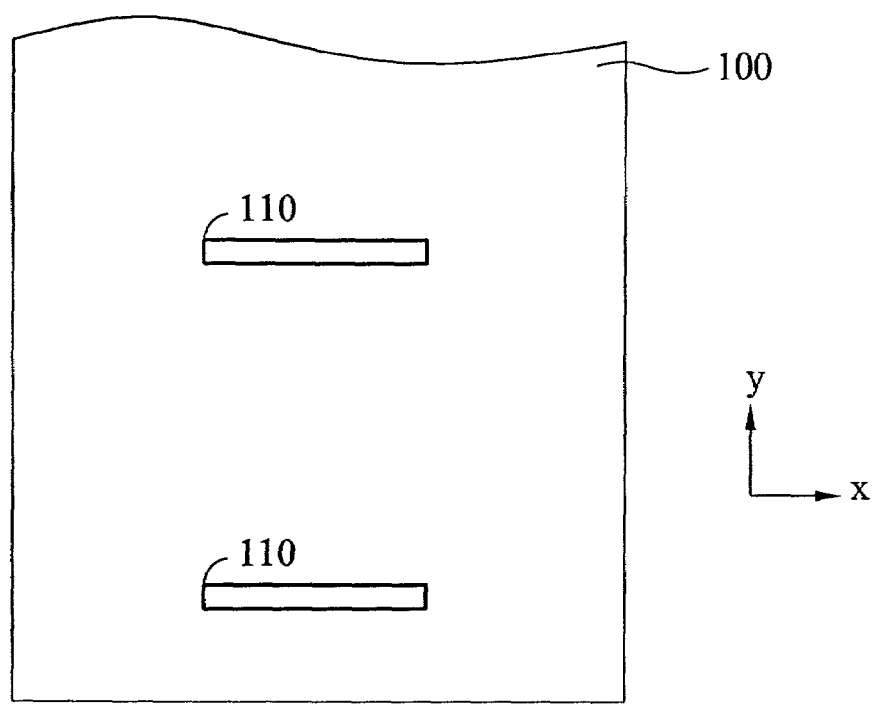
FIG. 3A shows a first checking pattern defined on a first semiconductor layer according to the second embodiment in the present invention.

FIG. 3A shows a first checking pattern defined on a first semiconductor layer according to the second embodiment in the present invention. In FIG. 3A, the first checking pattern comprises a pair of first parallel line-shaped patterns with two parallel lines. The first checking pattern 110 is defined by exposing a first photomask on the first semiconductor Layer 100 and then developing the pattern 110 thereon.

Figure 3B:
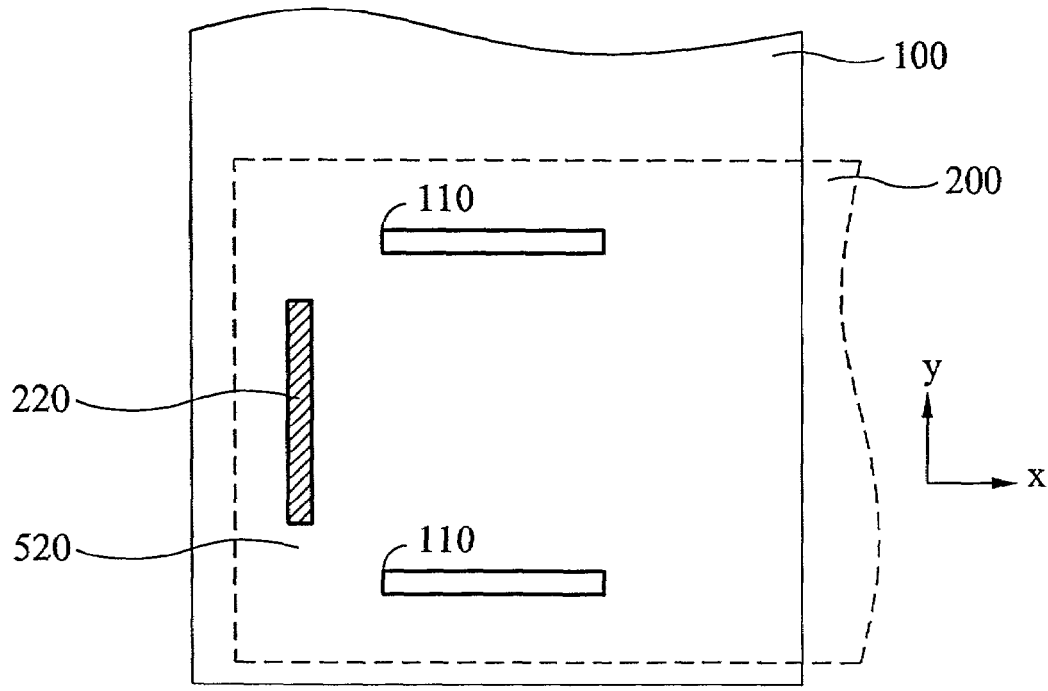
FIG. 3B shows a second checking pattern defined on a second semiconductor layer according to the second embodiment in the present invention.

FIG. 3B shows a second checking pattern defined on a second semiconductor layer according to the second embodiment in the present invention. In FIG. 3B, the second checking pattern comprises the second line-shaped pattern 220 located on one side of the first checking pattern 110 and perpendicular to the first checking pattern 110. The second checking pattern 220 is defined by exposing a second photomask on the second semiconductor layer 200 and then developing the pattern 220 thereon.

Figure 3C:
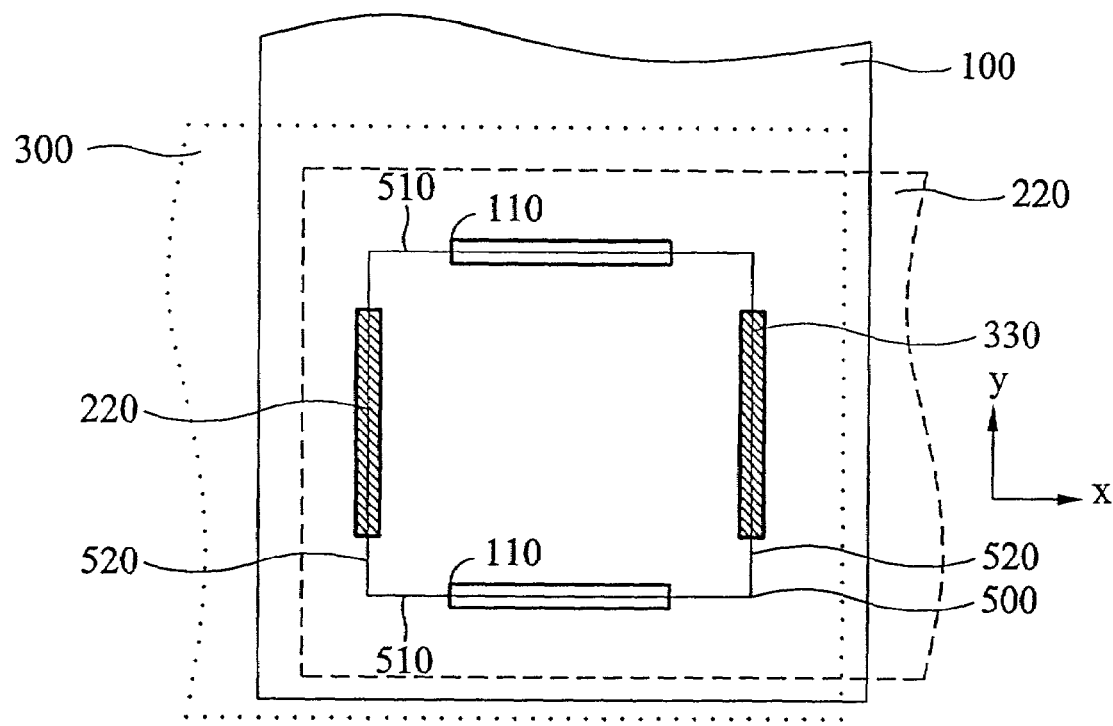
FIG. 3C shows a third checking pattern defined on a third semiconductor layer according to the second embodiment in the present invention.

FIG. 3C shows a third checking pattern defined on a third semiconductor layer according to the second embodiment in the present invention. In FIG. 3C, the third checking pattern comprises the third line-shaped pattern 330 located on one side of the first checking pattern 110 and perpendicular to the first checking pattern 110. The third checking pattern 330 is defined by exposing a third photomask on the third semiconductor layer 300 and then developing the pattern 330 thereon.

As FIG. 3C shows, the pair of first parallel line-shaped patterns 110, the second line-shaped pattern 220 and the third line-shaped pattern 330 are arranged to define a first rectangular frame 500. The first pair of parallel sides 510 of the first rectangular frame 500 is constructed by the first parallel line-shaped patterns 110, and the second pair of parallel sides 520 of the first rectangular frame 500 is constructed by the second line-shaped pattern 220 and the third line-shaped pattern 330. The third line-shaped pattern 330 is parallel to the second line-shaped pattern 220 and the second and third line-shaped patterns are on the two sides of the second pair of parallel sides 520 of the first rectangular frame 500 respectively.

Figure 3D:
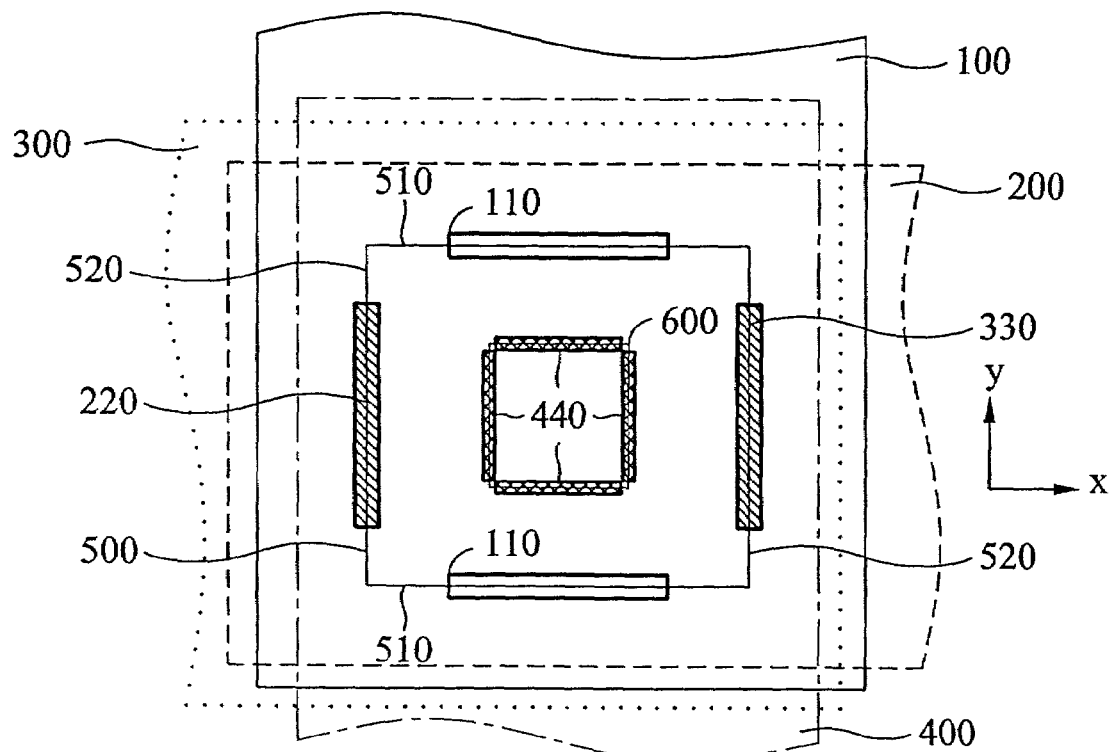
FIG. 3D shows a fourth checking pattern defined on a fourth semiconductor layer according to the second embodiment in the present invention.

FIG. 3D shows a fourth checking pattern defined on a fourth semiconductor layer according to the second embodiment in the present invention. The fourth checking pattern 440 is defined by exposing the fourth photomask on the fourth semiconductor layer 400 and then developing the pattern 440 thereon. As FIG. 3D shows, the fourth photomask defines a second rectangular frame 600 as the fourth checking pattern 440 constructed by four lines on the fourth semiconductor layer 400 and the fourth checking pattern 440 is surrounded by the first rectangular frame 500.

After the checking patterns are formed on the four stacked semiconductor layers, overlap accuracy of the resulting target patterns on the four semiconductor layer is measured by overlay scanning. As FIG. 3D shows, the center position Y'0 of the first checking pattern 110 along the first dimension (i.e. Y-axis) is obtained and the center position Y'1 of the fourth checking pattern 440 on the fourth semiconductor layer along the Y-axis is also measured. When the difference between Y'0 and Y'1 is within a predetermined error range, the resulting target patterns on the fourth semiconductor layer align with those on the first semiconductor layer along the Y-axis.

Subsequently, the center positions of the second checking pattern and the third checking pattern are measured by overlap scanning. The second checking pattern 220 on one side of the second pair of parallel sides 520 and the third checking pattern 330 on the other side of the second pair of parallel sides 520 are measured. A average value of the second checking pattern 220 on one side of the second pair of parallel sides 520 and the third checking pattern 330 on the other side of the second pair of parallel sides 520 is obtained to represent the center position of the second checking pattern 220 and the third checking pattern 330. Subsequently, the center position of the fourth checking pattern 440 along the X-axis is measured. When the difference between the center position of the second checking pattern 220 and the third checking pattern 330 and the center position of the fourth checking pattern 440 along the X-axis is within a predetermined error range, the resulting target patterns on the fourth semiconductor layer align with those on the second and third semiconductor layers along the X-axis.

Figure 4A:
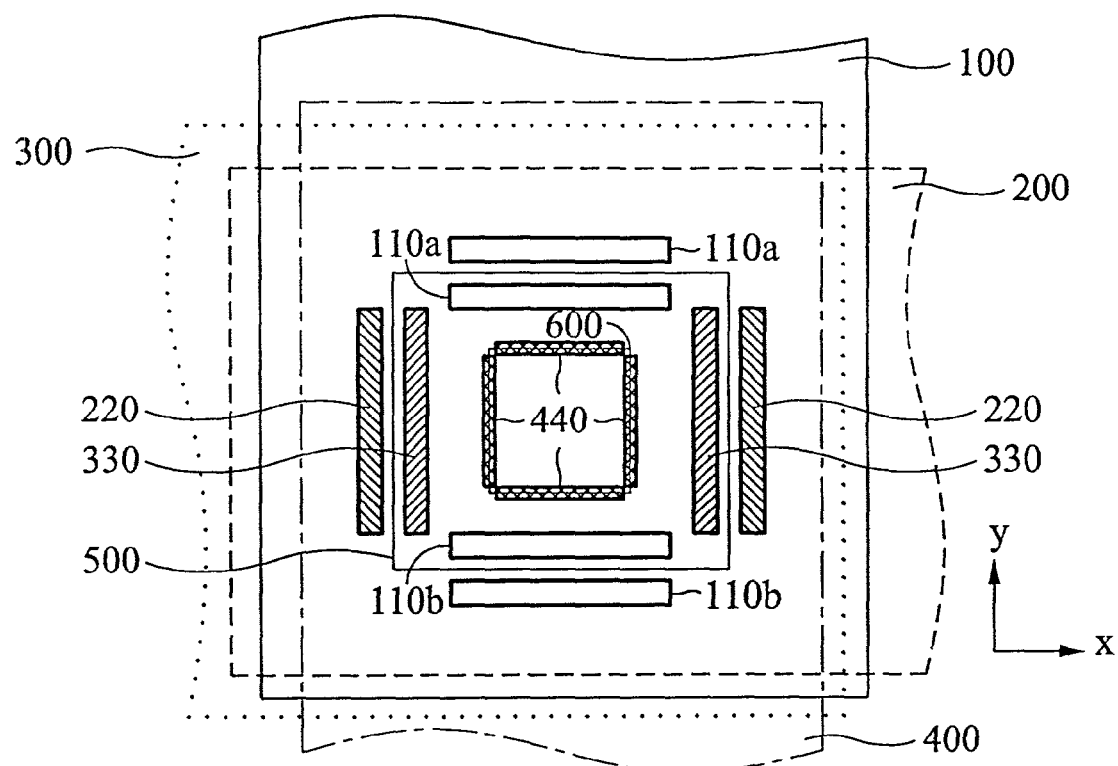
FIG. 4A shows one modification of the first embodiment in the present invention.

FIG. 4A shows one modification of the first embodiment in the present invention. The third parallel line-shaped patterns 330 are located inside the second pair of parallel sides of the first rectangular frame 500 and the second parallel line-shaped patterns 220 are located outside the second pair of parallel sides. Accordingly, the interval between the two lines of the second parallel line-shaped patterns 220 is larger than the interval between the two lines of the third parallel line-shaped patterns 330. The third parallel line-shaped patterns 330 are parallel to the second parallel line-shaped patterns 220.

Figure 4B:
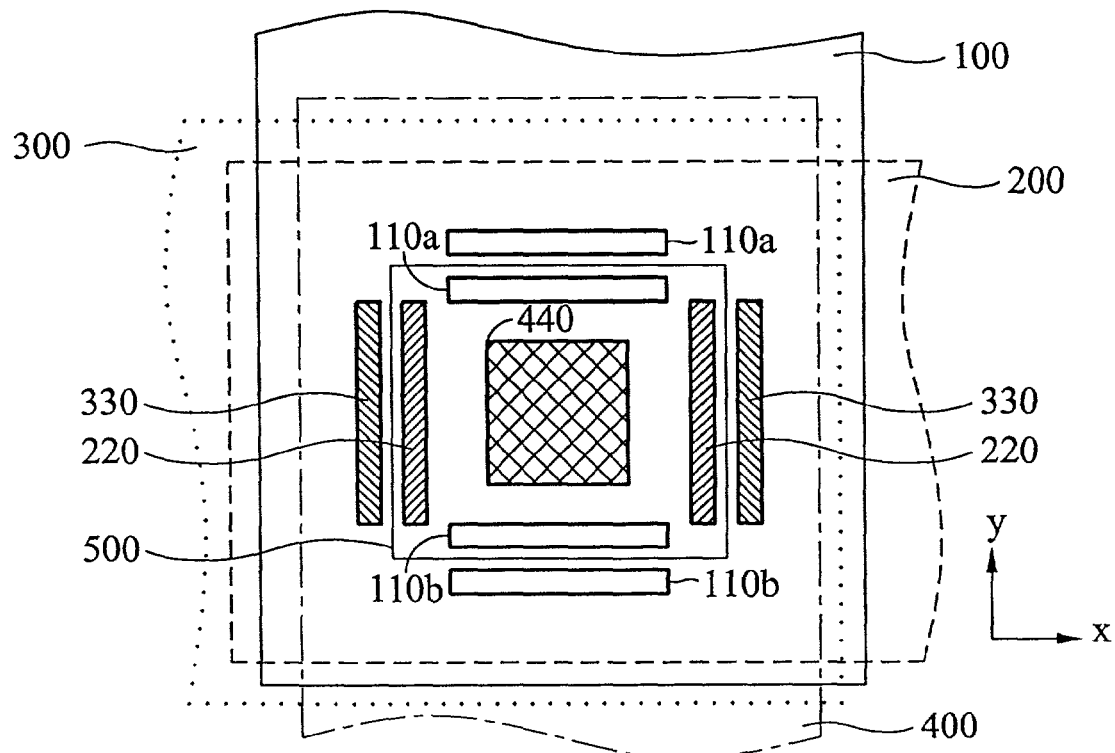
FIG. 4B shows another modification of the first embodiment in the present invention.

FIG. 4B shows another modification of the first embodiment in the present invention. The fourth checking pattern 440 is defined by exposing the fourth photomask on the fourth semiconductor layer 400 and then developing the pattern 440 thereon. As FIG. 4B shows, the fourth photomask defines a second rectangular pattern as the fourth checking pattern 440 on the fourth semiconductor layer 400 and the fourth checking pattern 440 is surrounded by the first rectangular frame 500.

Figure 4C:
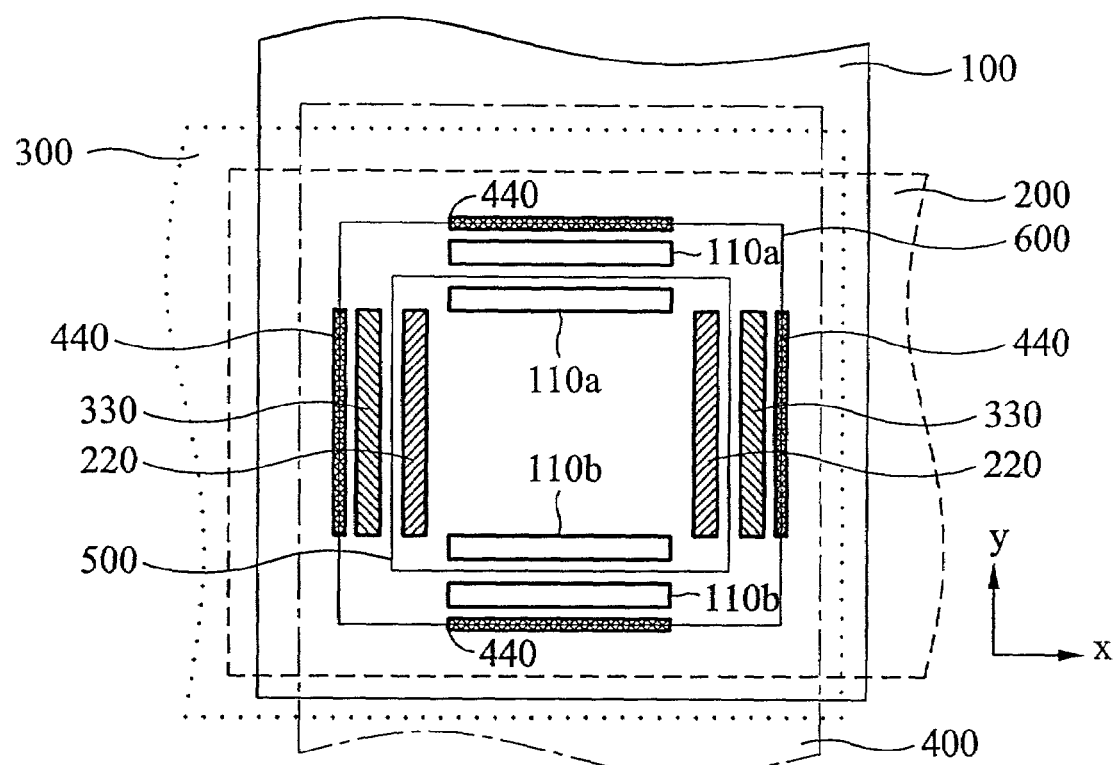
FIG. 4C shows still another modification of the first embodiment in the present invention.

FIG. 4C shows still another modification of the first embodiment in the present invention. The fourth checking pattern 440 is formed by exposing the fourth photomask on the fourth semiconductor layer 400 and then developing the pattern 440 thereon. As FIG. 4C shows, the fourth photomask defines a second rectangle frame 600 as the fourth checking pattern 440 on the fourth semiconductor layer 400 and the first rectangular frame 500 is surrounded by the fourth checking pattern 440.

Figure 4D:
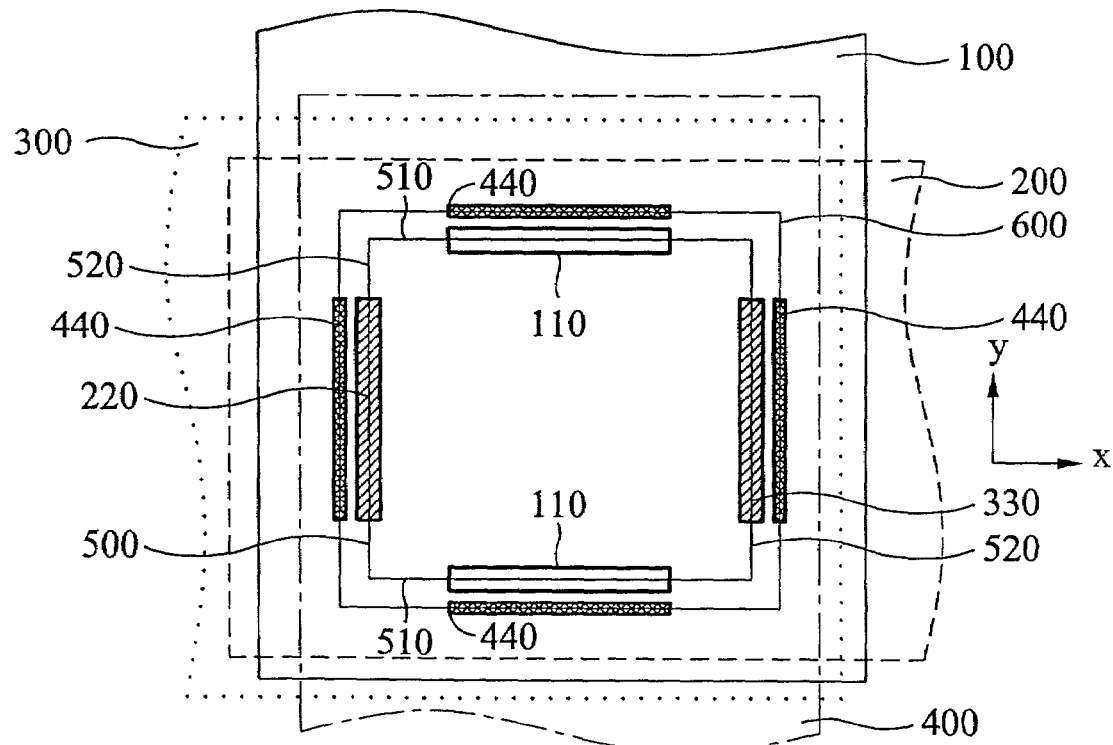
FIG. 4D shows one modification of the second embodiment in the present invention.

FIG. 4D shows one modification of the second embodiment in the present invention. The fourth checking pattern 440 is formed by exposing the fourth photomask on the fourth semiconductor layer 400 and then developing the pattern 440 thereon. As FIG. 4D shows, the fourth photomask defines a second rectangular frame 600 as the fourth checking pattern 440 on the fourth semiconductor layer 400 and the first rectangular frame 500 is surrounded by the fourth checking pattern 440.

If the difference between the center position of the second checking pattern 220 and the third checking pattern 330 and the center position of the fourth checking pattern 440 along the X-axis and/or the difference between the center position of the first checking pattern 110 along the Y-axis and the center position of the fourth checking pattern 440 along the Y-axis are not within the corresponding predetermined error ranges, which means the target patterns on the fourth semiconductor layer misalign with those on the first, second and/or third semiconductor layers, the patterns on the fourth semiconductor layer are removed and then re-exposed to form aligned patterns.

The relative alignment accuracy of the target patterns on four stacked semiconductor layers is checked according to the first and second embodiments in the present invention. The relative alignment accuracy of the target patterns on the first and the fourth semiconductor layer is measured along the first dimension and the relative alignment accuracy of the target patterns on the second, third and fourth semiconductor layer is measured along a direction perpendicular to the first dimension.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of checking relative alignment accuracy of patterns on four stacked semiconductor layers, comprising:
    defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns cooperate to define a first rectangular frame, the fourth checking pattern in its entirety is surrounded by the first rectangular frame, a first pair of parallel sides of the first rectangular frame is defined by the first checking pattern, and a second pair of parallel sides of the first rectangular frame is defined by the second and third checking patterns;
    measuring relative alignment accuracy between the fourth checking pattern and the first checking pattern; and
    measuring relative alignment accuracy between the fourth checking pattern and the second and third checking patterns.

2. The method as claimed in claim 1, wherein the second checking pattern comprises a pair of second parallel line-shaped patterns inside the second pair of parallel sides of the first rectangular frame respectively.

3. The method as claimed in claim 2, wherein the third checking pattern comprises a pair of third parallel line-shaped patterns outside the second pair of parallel sides of the first rectangular frame respectively.

4. The method as claimed in claim 1, wherein the fourth checking pattern comprises a fourth line-shaped pattern to form a second rectangular frame.

5. The method as claimed in claim 1, wherein the first checking pattern comprises two pairs of first line-shaped patterns on the first pair of parallel sides of the first rectangular frame respectively and the two pairs of first line-shaped patterns are parallel.

6. The method as claimed in claim 1, wherein the first checking pattern comprises a pair of first parallel line-shaped patterns on the first pair of parallel sides of the first rectangular frame respectively.

7. The method as claimed in claim 1, further comprising:
    measuring the first checking pattern to obtain a first position in a first dimension;
    measuring the fourth checking pattern to obtain a second position in the first dimension; and
    checking if the first and second positions fall within a predetermined error range.

8. The method as claimed in claim 3, further comprising:
    measuring the second and third line-shaped patterns on one side of the second pair of parallel sides of the first rectangular frame to obtain a first average position;
    measuring the second and third line-shaped patterns on the other side of the second pair of parallel sides of the first rectangular frame to obtain a second average position;
    averaging the first average position and the second average position to obtain a third position;
    overlap scanning the fourth checking pattern on the fourth semiconductor layer to obtain a fourth position of the fourth checking pattern along the direction parallel to the first pair of parallel sides; and
    checking if the third and fourth positions fall within a predetermined error range.

9. The method as claimed in claim 1, wherein the second checking pattern comprises a second line-shaped pattern on one side of the second pair of parallel sides of the first rectangular frame and the third checking pattern comprises a third line-shaped pattern on the other side of the second pair of parallel sides of the first rectangular frame.

10. The method as claimed in claim 9, further comprising:
    measuring the second line-shaped pattern on one side of the second pair of parallel sides of the first rectangular frame to obtain a first position of the second line-shaped pattern;
    measuring the third line-shaped pattern on the other side of the second pair of parallel sides of the first rectangular frame to obtain a second position of the third line-shaped pattern;
    averaging the first position of the second line-shaped pattern and the second position of the third line-shaped pattern to obtain a third position representing the average location of the second and third checking patterns;
    overlap scanning the fourth checking pattern along the direction parallel to the first pair of parallel sides of the first rectangular frame to obtain a fourth position; and
    checking if the third and fourth positions fall within a predetermined error range.

11. A method of checking relative alignment accuracy of patterns on four stacked semiconductor layers, comprising:
    defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns cooperate to define a first rectangular frame, a first pair of parallel sides of the first rectangular frame is defined by the first checking pattern, a second pair of parallel sides of the first rectangular frame is defined by the second and third checking patterns, and the fourth checking pattern in its entirety is arrayed as a second rectangular frame and is surrounded by the first rectangular frame;
    measuring relative alignment accuracy between the fourth checking pattern and the first checking pattern; and
    measuring relative alignment accuracy between the fourth checking pattern and the second and third checking patterns.

12. The method as claimed in claim 11, wherein the second checking pattern comprises a pair of second parallel line-shaped patterns inside the second pair of parallel sides of the first rectangular frame respectively.

13. The method as claimed in claim 12, wherein the third checking pattern comprises a pair of third parallel line-shaped patterns outside the second pair of parallel sides of the first rectangular frame respectively.

14. The method as claimed in claim 11, wherein the second checking pattern comprises a second line-shaped pattern on one side of the second pair of parallel sides of the first rectangular frame, and the third checking pattern comprises a third line-shaped pattern on the other side of the second pair of parallel sides of the first rectangular frame.

15. The method as claimed in claim 11, wherein the first checking pattern comprises two pairs of first line-shaped patterns on the first pair of parallel sides of the first rectangular frame respectively and the two pairs of first line-shaped patterns are parallel.

16. The method as claimed in claim 11, wherein the first checking pattern comprises a pair of first parallel line-shaped patterns on the first pair of parallel sides of the first rectangular frame respectively.

17. The method as claimed in claim 11, further comprising:
measuring the first checking pattern to obtain a first position in a first dimension;
measuring the fourth checking pattern to obtain a second position in the first dimension; and
checking if the first and second positions fall within a predetermined error range.

18. The method as claimed in claim 13, further comprising:
measuring the second and third line-shaped patterns on one side of the second pair of parallel sides of the first rectangular frame to obtain a first average position;
measuring the second and third line-shaped patterns on the other side of the second pair of parallel sides of the first rectangular frame to obtain a second average position;
averaging the first average position and the second average position to obtain a third position;
overlap scanning the fourth checking pattern on the fourth semiconductor layer to obtain a fourth position of the fourth checking pattern along the direction parallel to the first pair of parallel sides; and
checking if the third and fourth positions fall within a predetermined error range.

19. The method as claimed in claim 14, further comprising:
measuring the second line-shaped pattern on one side of the second pair of parallel sides of the first rectangular frame to obtain a first position of the second line-shaped pattern;
measuring the third line-shaped pattern on the other side of the second pair of parallel sides of the first rectangular frame to obtain a second position of the third line-shaped pattern;
averaging the first position of the second line-shaped pattern and the second position of the third line-shaped pattern to obtain a third position representing the average location of the second and third checking patterns;
overlap scanning the fourth checking pattern along the direction parallel to the first pair of parallel sides of the first rectangular frame to obtain a fourth position; and
checking if the third and fourth positions fall within a predetermined error range.

20. A method of checking relative alignment accuracy of patterns on four semiconductor layers, comprising:
defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns define a first rectangle, the fourth checking pattern defines a second rectangle which in its entirety is either surrounded by or surrounds the first rectangle, a first pair of parallel sides of the first rectangle is defined by the first checking pattern, and a second pair of parallel sides of the first rectangle is defined by the second and third checking patterns;
measuring relative alignment accuracy between the fourth checking pattern and the first checking pattern; and
measuring relative alignment accuracy between the fourth checking pattern and the second and third checking patterns.

21. A method of checking relative alignment accuracy of patterns on four stacked semiconductor layers, comprising:
defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns cooperate to define a first rectangular frame and the fourth checking pattern defines a second rectangular frame, the first rectangular frame in its entirety is surrounded by the fourth rectangular frame, a first pair of parallel sides of the first rectangular frame is defined by the first checking pattern, and a second pair of parallel sides of the first rectangular frame is defined by the second and third checking patterns;
measuring relative alignment accuracy between the fourth checking pattern and the first checking pattern; and
measuring relative alignment accuracy between the fourth checking pattern and the second and third checking patterns.

22. The method as claimed in claim 21, wherein the second checking pattern comprises a pair of second parallel line-shaped patterns inside the second pair of parallel sides of the first rectangular frame respectively.

23. The method as claimed in claim 22, wherein the third checking pattern comprises a pair of third parallel line-shaped patterns outside the second pair of parallel sides of the first rectangular frame respectively.

24. The method as claimed in claim 21, wherein the fourth checking pattern comprises a fourth line-shaped pattern to form a second rectangular frame.

25. The method as claimed in claim 21, wherein the first checking pattern comprises two pairs of first line-shaped patterns on the first pair of parallel sides of the first rectangular frame respectively and the two pairs of first line-shaped patterns are parallel.

26. The method as claimed in claim 21, wherein the first checking pattern comprises a pair of first parallel line-shaped patterns on the first pair of parallel sides of the first rectangular frame respectively.

27. The method as claimed in claim 21, further comprising:
measuring the first checking pattern to obtain a first position in a first dimension;
measuring the fourth checking pattern to obtain a second position in the first dimension; and
checking if the first and second positions fall within a predetermined error range.

28. The method as claimed in claim 23, further comprising:
  measuring the second and third line-shaped patterns on one side of the second pair of parallel sides of the first rectangular frame to obtain a first average position;
  measuring the second and third line-shaped patterns on the other side of the second pair of parallel sides of the first rectangular frame to obtain a second average position;
  averaging the first average position and the second average position to obtain a third position;
  scanning the fourth checking pattern on the fourth semiconductor layer to obtain a fourth position of the fourth checking pattern along the direction parallel to the first pair of parallel sides; and
  checking if the third and fourth positions fall within a predetermined error range.

29. The method as claimed in claim 21, wherein the second checking pattern comprises a second line-shaped pattern on one side of the second pair of parallel sides of the first rectangular frame and the third checking pattern comprises a third line-shaped pattern on the other side of the second pair of parallel sides of the first rectangular frame.

30. The method as claimed in claim 29, further comprising:
  measuring the second line-shaped pattern on one side of the second pair of parallel sides of the first rectangular frame to obtain a first position of the second line-shaped pattern;
  measuring the third line-shaped pattern on the other side of the second pair of parallel sides of the first rectangular frame to obtain a second position of the third line-shaped pattern;
  averaging the first position of the second line-shaped pattern and the second position of the third line-shaped pattern to obtain a third position representing the average location of the second and third checking patterns;
  scanning the fourth checking pattern along the direction parallel to the first pair of parallel sides of the first rectangular frame to obtain a fourth position; and
  checking if the third and fourth positions fall within a predetermined error range.

31. A method of checking relative alignment accuracy of patterns on four stacked semiconductor layers, comprising:
  defining a first checking pattern on a first semiconductor layer, a second checking pattern on a second semiconductor layer, a third checking pattern on a third semiconductor layer and a fourth checking pattern on a fourth semiconductor layer, wherein the first, second and third checking patterns cooperate to define a first rectangular frame, a first pair of parallel sides of the first rectangular frame is defined by the first checking pattern, a second pair of parallel sides of the first rectangular frame is defined by the second and third checking patterns, and the fourth checking pattern in its entirety is arrayed as a second rectangular frame which surrounds the first rectangular frame;
  measuring relative alignment accuracy between the fourth checking pattern and the first checking pattern; and
  measuring relative alignment accuracy between the fourth checking pattern and the second and third checking patterns.

32. The method as claimed in claim 31, wherein the second checking pattern comprises a pair of second parallel line-shaped patterns inside the second pair of parallel sides of the first rectangular frame respectively.

33. The method as claimed in claim 32, wherein the third checking pattern comprises a pair of third parallel line-shaped patterns outside the second pair of parallel sides of the first rectangular frame respectively.

34. The method as claimed in claim 31, wherein the second checking pattern comprises a second line-shaped pattern on one side of the second pair of parallel sides of the first rectangular frame, and the third checking pattern comprises a third line-shaped pattern on the other side of the second pair of parallel sides of the first rectangular frame.

35. The method as claimed in claim 31, wherein the first checking pattern comprises two pairs of first line-shaped patterns on the first pair of parallel sides of the first rectangular frame respectively and the two pairs of first line-shaped patterns are parallel.

36. The method as claimed in claim 31, wherein the first checking pattern comprises a pair of first parallel line-shaped patterns on the first pair of parallel sides of the first rectangular frame respectively.

37. The method as claimed in claim 31, further comprising:
  measuring the first checking pattern to obtain a first position in a first dimension;
  measuring the fourth checking pattern to obtain a second position in the first dimension; and
  checking if the first and second positions fall within a predetermined error range.

38. The method as claimed in claim 33, further comprising:
  measuring the second and third line-shaped patterns on one side of the second pair of parallel sides of the first rectangular frame to obtain a first average position;
  measuring the second and third line-shaped patterns on the other side of the second pair of parallel sides of the first rectangular frame to obtain a second average position;
  averaging the first average position and the second average position to obtain a third position;
  overlap scanning the fourth checking pattern on the fourth semiconductor layer to obtain a fourth position of the fourth checking pattern along the direction parallel to the first pair of parallel sides; and
  checking if the third and fourth positions fall within a predetermined error range.

39. The method as claimed in claim 34, further comprising:
  measuring the second line-shaped pattern on one side of the second pair of parallel sides of the first rectangular frame to obtain a first position of the second line-shaped pattern;
  measuring the third line-shaped pattern on the other side of the second pair of parallel sides of the first rectangular frame to obtain a second position of the third line-shaped pattern;
  averaging the first position of the second line-shaped pattern and the second position of the third line-shaped pattern to obtain a third position representing the average location of the second and third checking patterns;
  overlap scanning the fourth checking pattern along the direction parallel to the first pair of parallel sides of the first rectangular frame to obtain a fourth position; and
  checking if the third and fourth positions fall within a predetermined error range.

* * * * *